US008835306B2

(12) United States Patent
Ryan et al.

(10) Patent No.: US 8,835,306 B2
(45) Date of Patent: Sep. 16, 2014

(54) METHODS FOR FABRICATING INTEGRATED CIRCUITS HAVING EMBEDDED ELECTRICAL INTERCONNECTS

(71) Applicant: GLOBALFOUNDRIES, Inc., Grand Cayman (KY)

(72) Inventors: Errol Todd Ryan, Clifton Park, NY (US); Kunaljeet Tanwar, Slingerlands, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/757,504

(22) Filed: Feb. 1, 2013

(65) Prior Publication Data

US 2014/0220775 A1     Aug. 7, 2014

(51) Int. Cl.
*H01L 21/768* (2006.01)
(52) U.S. Cl.
CPC .................................... *H01L 21/768* (2013.01)
USPC .................... 438/631; 438/618; 257/E23.011
(58) Field of Classification Search
None
See application file for complete search history.

(56) References Cited

U.S. PATENT DOCUMENTS

| 6,157,081 | A * | 12/2000 | Nariman et al. ............. 257/752 |
| 2002/0088117 | A1* | 7/2002 | Engel et al. .................. 29/852 |
| 2006/0091559 | A1* | 5/2006 | Nguyen et al. ............. 257/775 |
| 2007/0148966 | A1* | 6/2007 | Baks et al. .................. 438/638 |
| 2008/0171447 | A1 | 7/2008 | Wallow et al. |
| 2009/0023298 | A1 | 1/2009 | Deng et al. |

OTHER PUBLICATIONS

U.S. Appl. No. 13/362,981, filed Jan. 31, 2012.
U.S. Appl. No. 13/466,895, filed May 8, 2012.
Lu et al., "Reproducible Resistive-Switching Behavior in Copper-Nitride Thin Film Prepared by Plasma-Immersion Ion Implantation," Phys. Status Solidi A 208, No. 4, pp. 874-877, (2011).
Nosaka et al., "Thermal Decomposition of Copper Nitride Thin Films and Dots Formation by Electron Beam Writing," Applied Surface Science, 169-170, pp. 358-361, (2001).

* cited by examiner

*Primary Examiner* — Charles Garber
*Assistant Examiner* — Alia Sabur
(74) *Attorney, Agent, or Firm* — Ingrassia Fisher & Lorenz, P.C.

(57) ABSTRACT

A method for fabricating integrated circuits includes providing a substrate including a protecting layer over an oxide layer and etching a recess through the protecting layer and into the oxide layer. A barrier material is deposited over the substrate to form a barrier layer including a first region in the recess and a second region outside the recess. A conductive material is deposited over the barrier layer and forms an embedded electrical interconnect in the recess and an overburden region outside the recess. The overburden region of the conductive material is removed and a portion of the embedded electrical interconnect is recessed. Thereafter, the barrier layer is etched to remove the second region of the barrier layer and to recess a portion of the first region of the barrier layer. After etching the barrier layer, the protecting layer is removed from the oxide layer.

20 Claims, 7 Drawing Sheets

METHODS FOR FABRICATING INTEGRATED CIRCUITS HAVING EMBEDDED ELECTRICAL INTERCONNECTS

TECHNICAL FIELD

The present disclosure generally relates to methods for fabricating integrated circuits having embedded electrical interconnects, and more particularly, relates to methods for fabricating integrated circuits having an embedded electrical interconnect recessed within a substrate and with a barrier layer disposed between the embedded electrical interconnect and the substrate.

BACKGROUND

Integrated circuits generally include transistors connected by numerous levels of interconnect routing in the form of electrical interconnects embedded within a dielectric substrate. Each level of interconnect routing is separated from immediately adjacent levels by dielectric material, referred to as interlayer dielectric (ILD). The ILD generally includes an oxide layer, such as silicon dioxide formed from tetraethyl orthosilicate (TEOS), and may include one or more additional layers of dielectric material such as low-k or ultra-low k (ULK) material. Adjacent levels of interconnect routing may be embedded in distinct layers of ILD and configured to ensure that dielectric material separates adjacent interconnect routings.

As scaling of integrated circuits increases, aspect ratios of height to width of embedded electrical interconnects in interconnect routing have been maximized to minimize spacing between embedded electrical interconnects. However, minimized spacing between the embedded electrical interconnects leads to device reliability concerns attributable to various phenomena. One particular phenomenon that affects device reliability is time dependent dielectric breakdown (TDDB), which results from migration of metal ions from the embedded electrical interconnects into an interface between adjacent levels of the interconnect routing. TDDB is often exacerbated with decreased spacing between embedded electrical interconnects in interconnect routings. To inhibit TDDB, efforts have been made to recess embedded electrical interconnects within the ILD to offset embedded electrical interconnect surfaces from planes of interfaces between adjacent levels and to effectively form a barrier to flow of metal ions into the interfaces.

To further inhibit TDDB attributable to migration of metal ions from the embedded electrical interconnects into the interface between adjacent levels of the interconnect routing, a barrier layer, such as tantalum nitride, is often formed between the electrically-conductive material and the dielectric and oxide layers. A liner layer, such as tantalum, may be formed between the barrier layer and the electrically-conductive material to further assist as a barrier to flow of metal ions into the interface. Recessing of the barrier layer and the liner layer within the substrate is desirable to promote electrical insulation of the embedded electrical interconnects and to further minimize TDDB. However, there has been difficulty with employing the above techniques effectively due to uneven topography, reduction in the volume of ILD separating interconnect routing, and break down of the oxide layer.

Accordingly, it is desirable to provide methods for fabricating integrated circuits that recess embedded electrical interconnects and barrier layers within substrates while minimizing etching of oxide layers in the substrates. Further, it is desirable to provide methods for fabricating integrated circuits that provide improved techniques for recessing embedded electrical interconnects and adjacent barrier layers. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits are provided. In an embodiment, a method for fabricating an integrated circuit includes providing a substrate including a protecting layer over an oxide layer and etching a recess through the protecting layer and into the oxide layer. A barrier material is deposited over the substrate to form a barrier layer including a first region in the recess and a second region outside the recess. A conductive material is deposited over the barrier layer and forms an embedded electrical interconnect in the recess and an overburden region outside the recess. The overburden region of the conductive material is removed and a portion of the embedded electrical interconnect is recessed. After recessing the portion of the embedded electrical interconnect, the barrier layer is etched to remove the second region of the barrier layer and to recess a portion of the first region of the barrier layer. After etching the barrier layer, the protecting layer is removed from the oxide layer.

In another embodiment, a method for fabricating an integrated circuit includes providing a substrate including a protecting layer over an oxide layer. In the method, a recess is etched through the protecting layer and into the oxide layer. A barrier layer is formed over the substrate and includes a first region in the recess and a second region outside the recess. An electrically-conductive material is deposited over the barrier layer in the recess to form an embedded electrical interconnect and an overburden region. In the method, a planarization process is performed with a slurry to remove the overburden region. The slurry recesses a portion of the embedded electrical interconnect. After performing the planarization process, the barrier layer is etched to remove the second region of the barrier layer and to recess a portion of the first region of the barrier layer.

In another embodiment, a method for fabricating an integrated circuit involves providing a substrate including a protecting layer over an oxide layer having a thickness of no more than about 10 nanometers (nm). The method etches a recess through the protecting layer and into the oxide layer. A barrier material is deposited over the substrate to form a barrier layer including a first region in the recess and a second region outside the recess. The method further deposits an electrically-conductive material over the barrier layer in the recess to form an embedded electrical interconnect and an overburden region. The overburden region of the electrically-conductive material is removed. Further, a portion of the embedded electrical interconnect is recessed with an etchant while the barrier layer prevents the etchant from contacting the substrate. After recessing the portion of the embedded electrical interconnect, the barrier layer is etched to remove the second region of the barrier layer and to recess a portion of the first region of the barrier layer.

BRIEF DESCRIPTION OF THE DRAWINGS

Embodiments of methods for fabricating integrated circuits having embedded electrical interconnects will hereinafter be described in conjunction with the following drawing figures, wherein like numerals denote like elements, and wherein.

DETAILED DESCRIPTION

The following detailed description is merely exemplary in nature and is not intended to limit integrated circuits or the methods for fabricating integrated circuits as claimed herein. Furthermore, there is no intention to be bound by any expressed or implied theory presented in the preceding technical field, background or brief summary, or in the following detailed description.

Methods for fabricating integrated circuits are provided herein. The methods involve fabrication of integrated circuits having embedded electrical interconnects in a substrates of the integrated circuits. The integrated circuits can include a barrier layer between the embedded electrical interconnects and the substrates. For an integrated circuit, the methods allow an embedded electrical interconnect and barrier layer to be effectively recessed within a substrate while minimizing etching of the substrate's oxide layer. In particular, a protecting layer lies over the oxide layer during recessing of the embedded electrical interconnect and the barrier layer within the substrate, and at least a portion of the protecting layer remains over the oxide layer after recessing the barrier layer. In this manner, etching techniques that preferentially etch the barrier layer can be employed to recess the barrier layer. While etching techniques that preferentially etch the barrier layer may otherwise etch the oxide layer at a high rate, thereby breaking down and causing uneven topography of the oxide layer, etching of the oxide layer is minimized because the oxide layer is at least partially shielded from etching by the protecting layer. The protecting layer is removed after recessing the barrier layer. As a result, the embedded electrical interconnect and the barrier layer can be recessed to recess depths that are on a common plane, which promotes further layer formation over the recessed embedded electrical interconnect and barrier layer and which further results in maximized electrical insulation of the embedded electrical interconnect and barrier layer. The methods for forming integrated circuits, as described herein, are particularly useful for recessing embedded electrical interconnects and barrier layers within an interlayer dielectric substrate of an integrated circuit due to the maximized electrical insulation and promotion of further layer formation that is afforded by The methods.

Figure 1:
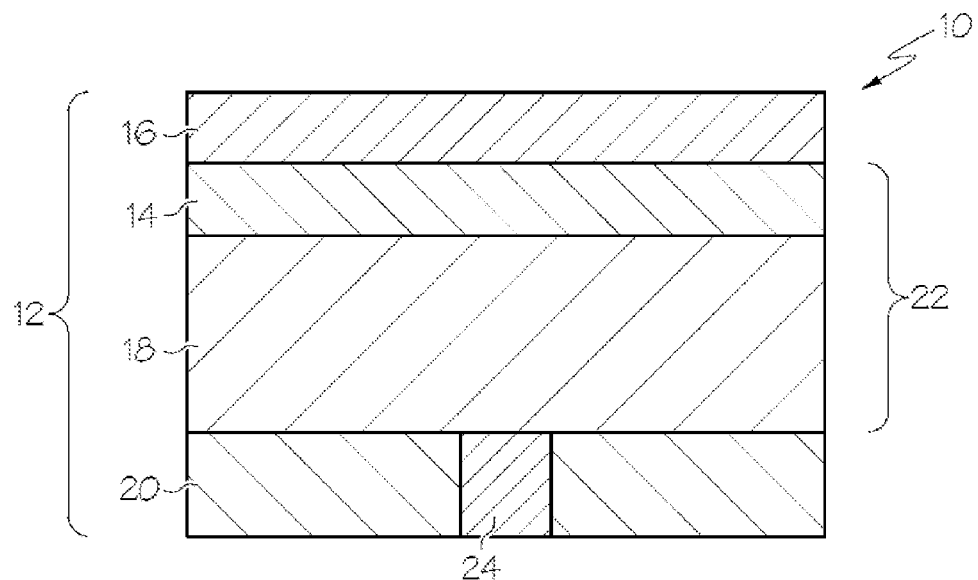
FIG. 1 is a cross-sectional side view of a portion of an integrated circuit including a base substrate, an underlying dielectric layer, an oxide layer, and a protecting layer.

In an embodiment of a method for forming an integrated circuit having an embedded electrical interconnect within a substrate, as shown in cross-section in FIG. 1, the method includes providing a substrate 12 that includes an oxide layer 14 and a protecting layer 16 that is disposed over the oxide layer 14. Optionally, as also shown in FIG. 1, the substrate 12 further includes an underlying dielectric layer 18, with the oxide layer 14 disposed over the underlying dielectric layer 18. Additionally, the substrate 12 may optionally include a base substrate 20, with the underlying dielectric layer 18 disposed over the base substrate 20. For purposes of the instant application, the oxide layer 14 and optional underlying dielectric layer 18, together with any other optional dielectric layers that remain after forming the integrated circuit in a given level of embedded electrical interconnects, may be referred to as an interlayer dielectric substrate 22. In the embodiment of FIG. 1, the oxide layer 14 is provided with the protecting layer 16 disposed directly thereon, with the oxide layer 14 disposed directly on the underlying dielectric layer 18, and with the underlying dielectric layer 18 disposed directly on the base substrate 20. However, it is to be appreciated that in other embodiments, additional layers can be disposed between the oxide layer 14 and the protecting layer 16, between the oxide layer 14 and the underlying dielectric layer 18, and/or between the underlying dielectric layer 18 and the base substrate 20. Accordingly, as used herein, the term "over" encompasses the words "on" and "overlying". Further, the oxide layer 14, protecting layer 16, underlying dielectric layer 18, and the base substrate 20 are generally configured in a stacked orientation.

Referring to FIG. 1, when included, the base substrate 20 may have an embedded electrical contact 24 disposed therein, and may include millions of embedded electrical contacts 24 disposed therein. In this regard, the embedded electrical contacts 24 may be formed with nanometer-scale dimensions, e.g., with dimensions less than $1 \times 10^{-6}$ mm. As shown in FIG. 1, the base substrate 20 may be a base dielectric substrate 12 including the embedded electrical contact 24 disposed therein, and may be formed from any dielectric material or may include layers of different dielectric materials. Alternatively, although not shown, the base substrate 20 may be a semiconductor substrate 12 that includes a device, such as a transistor, capacitor, resistor, or the like, with the embedded electrical contact 24 being in electrical communication with the device. Alternatively still, although again not shown, the base substrate 20 may be free of embedded electrical contacts 24 disposed therein and may be any substrate 12 upon which subsequent layers of dielectric material may be formed.

Figure 11:
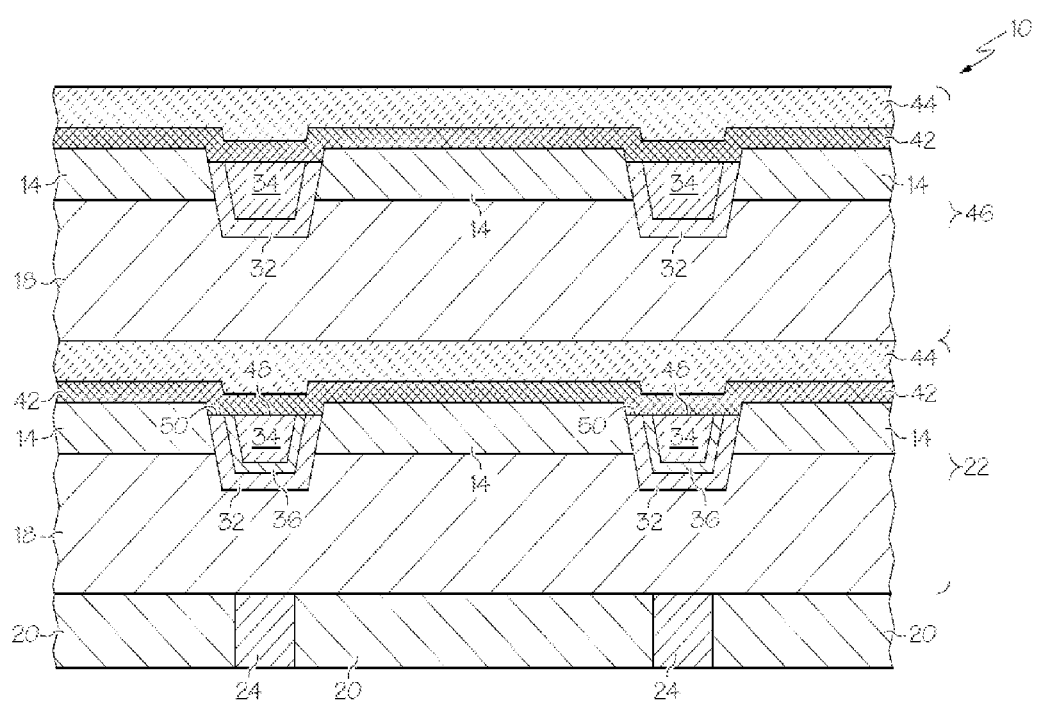
FIG. 11 is a schematic cross-sectional side view of a portion of an embodiment of an integrated circuit prepared in accordance with The methods described herein.

The optional underlying dielectric layer 18, depending upon the particular application, can be formed from a low k or ultra-low k dielectric material, such as a silsesquioxane polymer, organosilicate glass, carbon-doped glass, or other SiCOH material, so long as the material used to form the underlying dielectric layer 18 is different from the material used to form the oxide layer 14. Such low k or ultra-low k dielectric materials are known in the art and are particularly useful when the instant process is utilized to form integrated circuits 10 as shown in FIG. 11. The underlying dielectric layer 18 may be formed over the base substrate 20 through conventional techniques such as spin coating.

The oxide layer 14 can be formed from any insulating oxide, and is typically formed from a silicon oxide, such as silicon dioxide. For example, tetraethyl orthosilicate (TEOS) precursor may be employed to form the silicon dioxide that forms the oxide layer 14. Formation of oxide layers using TEOS precursor is known in the art, and such oxide layers may be formed through conventional techniques such as chemical vapor deposition (CVD).

The protecting layer 16 is not particularly limited and is a sacrificial layer that is present for purposes of shielding the oxide layer 14 from processing techniques that are conducted in accordance with the instant method that would otherwise degrade or remove material from the oxide layer 14. For example, the protecting layer 16 can be formed from material that exhibits a slower etch rate in a dry etchant than the material used to form the oxide layer 14. In an embodiment, the protecting layer 16 is formed from material that has a higher wet etch rate than dry etch rate. In one specific embodiment, the protecting layer 16 includes titanium nitride and can be formed through conventional techniques such as chemical vapor deposition (CVD).

Figure 2:
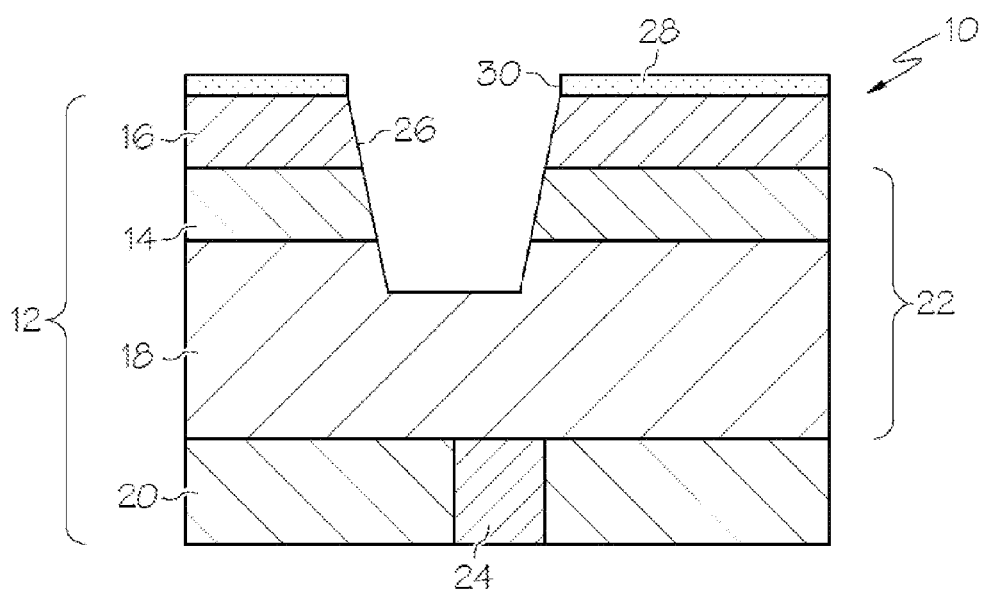
FIG. 2 is a cross-sectional side view of a portion of the integrated circuit of FIG. 1 including an etch mask patterned over the protecting layer, with the etch mask having a patterned recess and with a recess etched through the protecting layer and the oxide layer and partially into the underlying dielectric layer.
Figure 3:
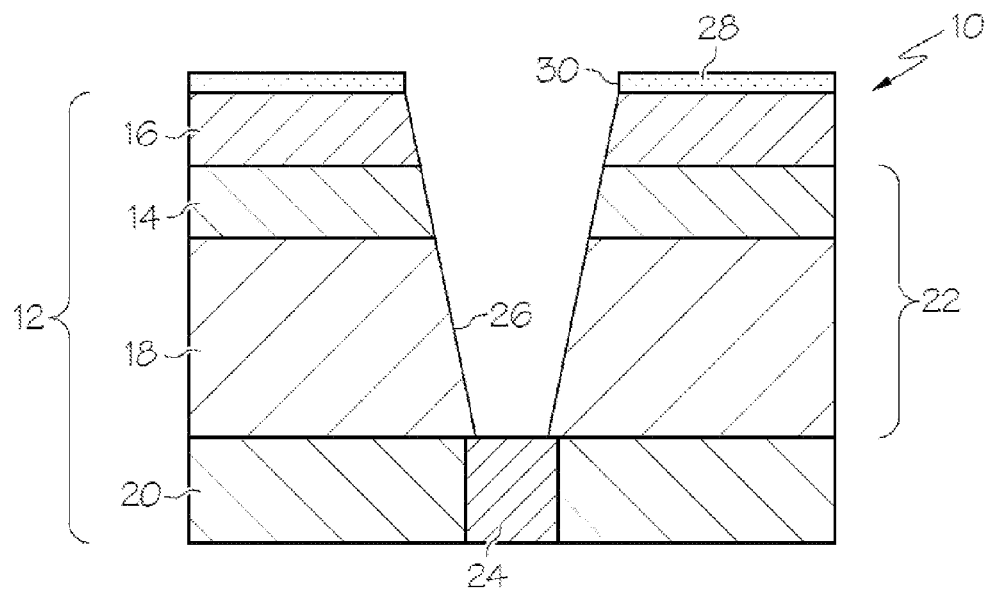
FIG. 3 is a schematic cross-sectional side view of a portion of the integrated circuit of FIG. 1 including an etch mask patterned over the protecting layer, with the etch mask having a patterned recess and with a recess etched through the protecting layer, the oxide layer, and the underlying dielectric layer.

The exemplary method continues with etching a recess 26 through the protecting layer 16 and at least partially into the oxide layer 14 as shown in FIGS. 2 and 3. Although not shown, it is to be appreciated that a plurality of recesses 26 can be etched. To etch the recess 26, an etch mask 28 may be formed and patterned over the protecting layer 16, with the etch mask 28 having patterned recesses 30 that selectively expose a surface of the protecting layer 16. The recess 26 is then etched through the protecting layer 16 and at least partially into the oxide layer 14 through the patterned recesses 30 in the etch mask 28, with multiple cycles of etching conducted with appropriate etchants for at least the protecting layer 16 and the oxide layer 14. In the embodiments shown in FIGS. 2 and 3, the recess 26 is etched through the oxide layer 14 and at least partially into the underlying dielectric layer 18. In the embodiment of FIG. 2, the recess 26 is etched through the protecting layer 16, the oxide layer 14, and only partially into the underlying dielectric layer 18 and illustrates formation of the recess 26 in a trench configuration. In the embodiment of FIG. 3, the recess 26 is a via and is etched through the protecting layer 16, the oxide layer 14, and the underlying dielectric layer 18. For example, when the protecting layer 16 includes titanium nitride, dry etching using etchants such as, but not limited to, $CHF_3$, $CF_4$, or $SF_6$, can be used to etch both the protecting layer 16 and the oxide layer 14. In this embodiment, the via 26 is etched over the embedded electrical contact 24 that is disposed in the base substrate 20 and exposes a surface of the embedded electrical contact 24.

Figure 4:
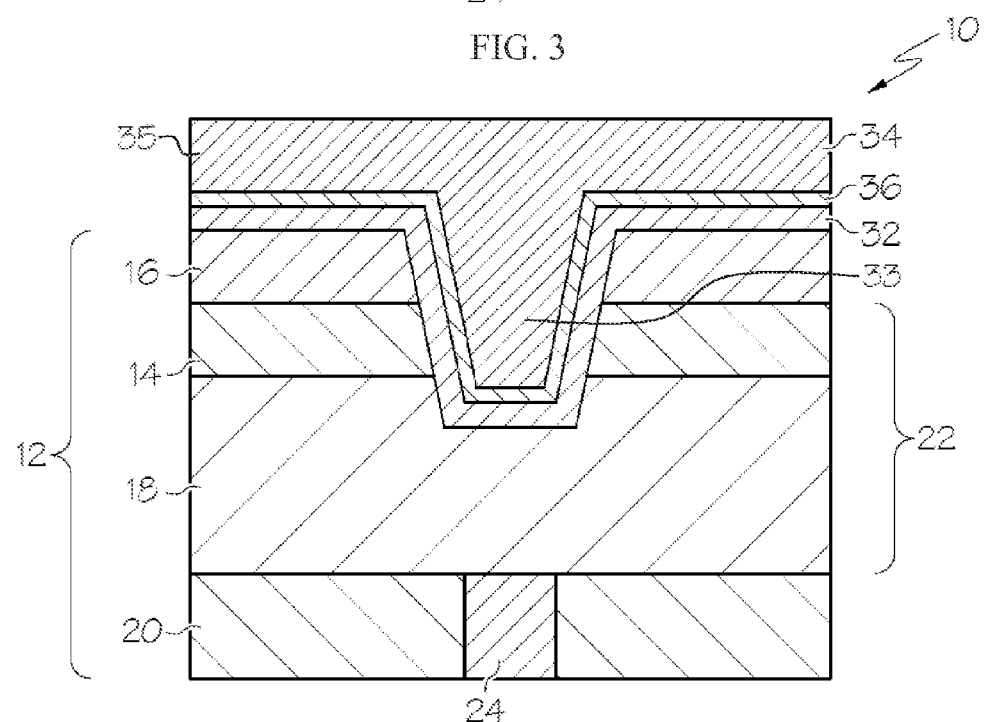
FIG. 4 is a schematic cross-sectional side view of a portion of the integrated circuit of FIG. 2 including the recess, with a barrier material, a liner material, and an electrically-conductive material deposited over the protecting layer and in the recess to form a barrier layer, liner layer, and embedded electrical interconnect, respectfully, in the recess.

Referring to FIG. 4, a barrier material is deposited in the recess 26 to form a barrier layer 32 over the protecting layer 16 and oxide layer 14 in the recess 26, followed by depositing an electrically-conductive material over the barrier layer 32 in the recess 26 to form an embedded electrical interconnect 34. The barrier layer 32 functions as a barrier to diffusion of metal ions from the electrically-conductive material of the embedded electrical interconnect 34 into an interface between layers in the substrate 12. In addition to the barrier layer 32, a liner material may be deposited over the barrier layer 32 in the recess 26 to form a liner layer 36, which provides a further barrier to diffusion of the metal ions. In certain embodiment, layers 32 and 36 together may be considered to comprise a barrier layer. When the liner layer 36 is present, the electrically-conductive material is deposited over the liner layer 36. In an embodiment, and as shown in FIG. 4, the electrically-conductive material is deposited directly upon the liner layer 36. It is to be appreciated that the barrier material, the liner material, and the electrically-conductive material are generally uniformly deposited over the substrate 12, including over the surface of the protecting layer 16 in addition to depositing in the recess 26.

As shown in FIG. 4, each of the barrier material, electrically-conductive material, and liner material are deposited in a first region 33 within the recess 26 and a second region 35 outside the recess 26. The second region 35 of the electrically-conductive material 34 is considered to be an overburden region of excess material.

Techniques for forming barrier layers 32, liner layers 36, and embedded electrical interconnects 34 are known in the art. The barrier layer 32 is generally formed from a barrier material that is different from materials that are used to form the protecting layer 16, the oxide layer 14, and the optional underlying dielectric layer 18. In an embodiment, the barrier material is a refractory metal nitride, such as a nitride of niobium, molybdenum, tantalum, tungsten, or rhenium. Refractory metal nitrides provide excellent diffusion barrier properties and that also exhibits chemical stability and high electrical conductivity. One specific example of a suitable refractory metal nitride that is suitable for the barrier material is tantalum nitride. When the liner layer 36 is formed, the liner material is different from the barrier material and, in an embodiment, is chosen from, but is not limited to, elemental tantalum, cobalt, rhenium, niobium, vanadium, ruthenium, or a combination thereof. The electrically-conductive material is different from the barrier material and liner material and has sufficient electrical conductivity to facilitate electrical connection in a circuit, e.g., with electrical resistivity of less than or equal to about 30 $\mu\Omega \cdot cm$. Examples of suitable electrically-conductive materials include metals such as, but not limited to, copper, titanium, or tungsten. In an embodiment, the electrically-conductive material is substantially pure copper (e.g., at least about 99% pure) and may be electronics grade copper that is suitable for sensitive circuitry of integrated circuits 10. In an embodiment, the embedded electrical interconnect 34 is in the form of one or more dots and/or lines, depending upon a pattern of recesses 26 formed in the substrate 12.

Figure 5:
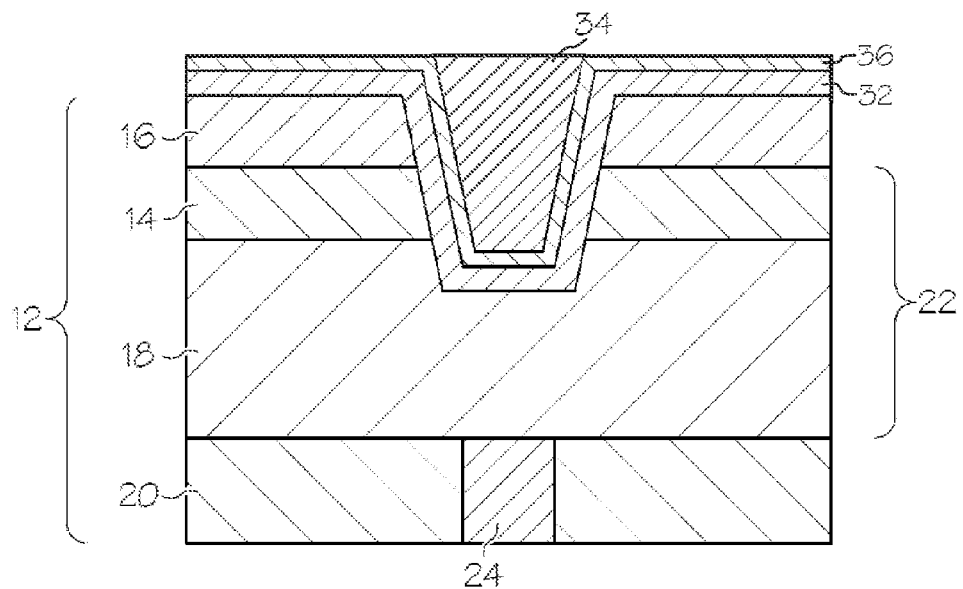
FIG. 5 is a schematic cross-sectional side view of a portion of the integrated circuit of FIG. 4 after removal of excess barrier material.
Figure 6:
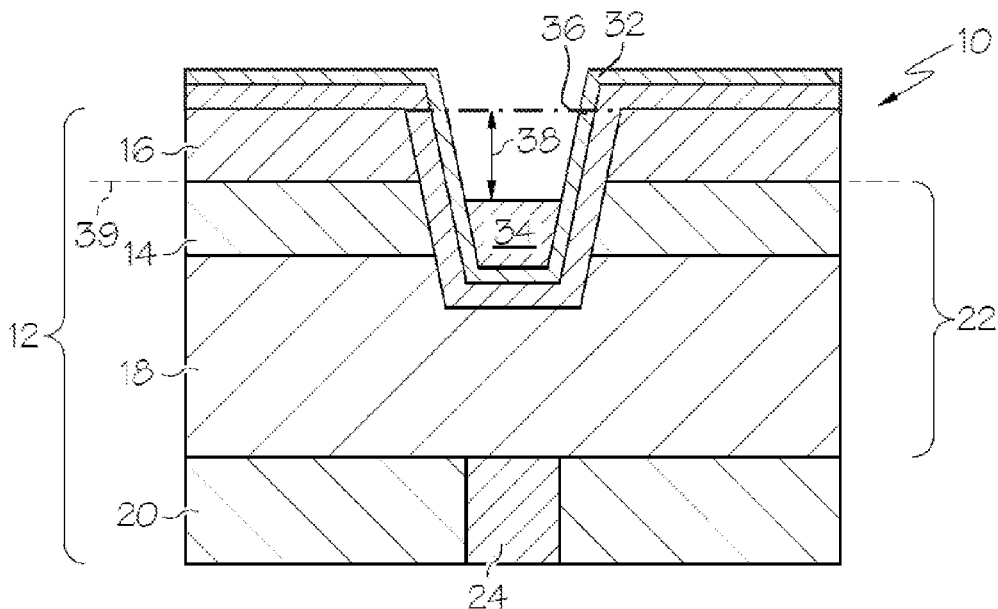
FIG. 6 is a schematic cross-sectional side view of a portion of the integrated circuit of FIG. 5, with the embedded electrical interconnect recessed within the substrate.

After depositing the electrically-conductive material to form the embedded electrical interconnect 34, and as shown in FIG. 5, the overburden region 35 of excess electrically-conductive material is removed. Specifically, a chemical-mechanical planarization (CMP) process is performed and lands on the liner layer 36 (or on the barrier layer 32, if the liner layer 36 is not used). As a result, the overburden region 35 of the electrically-conductive material is removed. In certain embodiments, the CMP process ends and results in the structure shown in FIG. 5. In other embodiments, the CMP process may be performed with a chemical slurry that is able to etch the electrically-conductive material. As a result, the CMP process may recess the electrically-conductive material into the recess 26, as shown in FIG. 6, to expose a surface of the embedded electrical interconnect 34. The embedded electrical interconnect 34 is recessed to an interconnect recess depth 38 beneath a surface plane 39 of the oxide layer 14.

As alluded to above, and as shown in FIG. 6, if the CMP process does not recess the embedded electrical interconnect 34, then the process continues with a separate step for recessing the embedded electrical interconnect 34 within the substrate 12. In an embodiment, the embedded electrical interconnect 34 is recessed by wet etching the embedded electrical interconnect 34. An appropriate wet etchant may be used to wet etch the embedded electrical interconnect 34, such as Standard Clean 1 (SC1), Standard Clean 2 (SC2), or other peroxide based chemistries to oxidize the metal followed by HF or citric acid to remove the metal oxide layer. The embedded electrical interconnect 34 is recessed to an interconnect recess depth 38, and etching may be conducted until a desired interconnect recess depth 38 is achieved. The interconnect recess depth 38 is at least beneath a surface plane 39 of the oxide layer 14, thereby offsetting the embedded electrical interconnect 34 from the surface plane 39 of the oxide layer 14 and effectively forming a barrier to flow of metal ions from the embedded electrical interconnect 34 into the interface between the oxide layer 14 and a subsequently formed capping layer (as described in further detail below). In an embodiment, the interconnect recess depth 38 is at least 4 nm beneath the surface plane 39 of the oxide layer 14.

Figure 7:
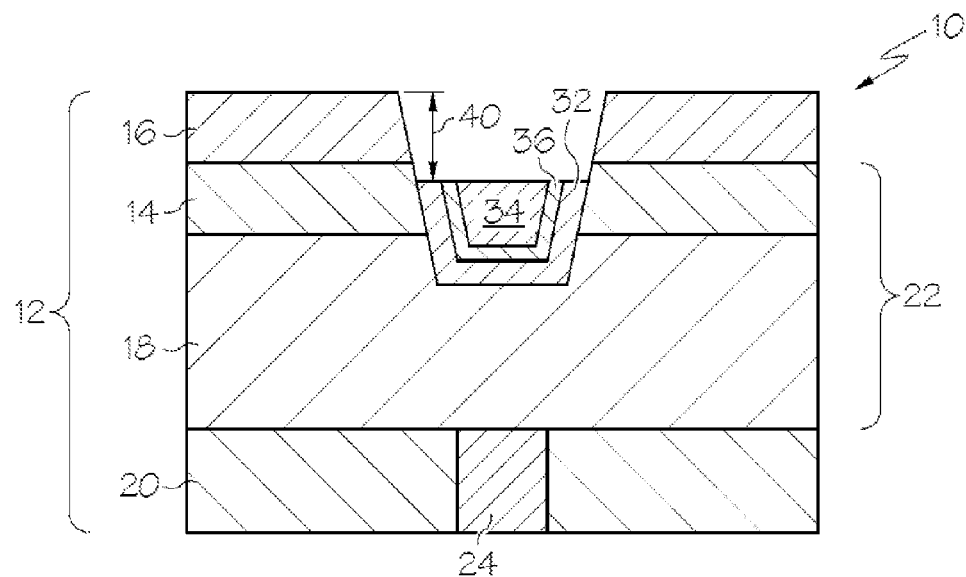
FIG. 7 is a schematic cross-sectional side view of a portion of the integrated circuit of FIG. 6, with the barrier layer and liner layer recessed within the substrate.

Referring to FIG. 7, after recessing the embedded electrical interconnect 34, the second regions 35 of the barrier layer 32 and liner layer 36 are removed and the first regions 33 of the barrier layer 32 and liner layer 36 are recessed within the substrate 12. The barrier material and the liner material generally have a lower etch rate in the wet etchant than the electrically-conductive material such that wet etching is insufficient to effectively etch the barrier material and liner material (when present). In an embodiment, the barrier layer 32 and the liner layer 36 are recessed by dry etching. Dry etching is also referred to in the art as plasma etching and examples of suitable etchants that can be used in dry etching include, but are not limited to, $CHF_3$, $CF_4$, or $SF_6$. Because dry etching using the aforementioned etchants is also generally effective for etching oxides, the oxide layer 14 is vulnerable to etch if exposed to dry etching. However, the barrier layer 32, liner layer 36, and protecting layer 16 are still present over the oxide layer 14 during recessing of the embedded electrical interconnect 34 and beginning recessing of the barrier layer 32 and liner layer 36. Further, at least a portion of the protecting layer 16 remains over the oxide layer 14 after recessing the barrier layer 32 and liner layer 36 to ensure that the oxide layer 14 is sufficiently shielded from exposure to dry etching.

The barrier layer 32 and, when present, the liner layer 36 are recessed to a barrier recess depth 40. In an embodiment, to provide an even surface upon which further layers may be formed, the barrier recess depth 40 is on common plane with the interconnect recess depth 38. By "common plane", it is meant that the barrier recess depth 40 and the interconnect recess depth 38 have an offset of less than about 2 nm, such as from an equal plane to an offset of about 7 nm.

Figure 8:
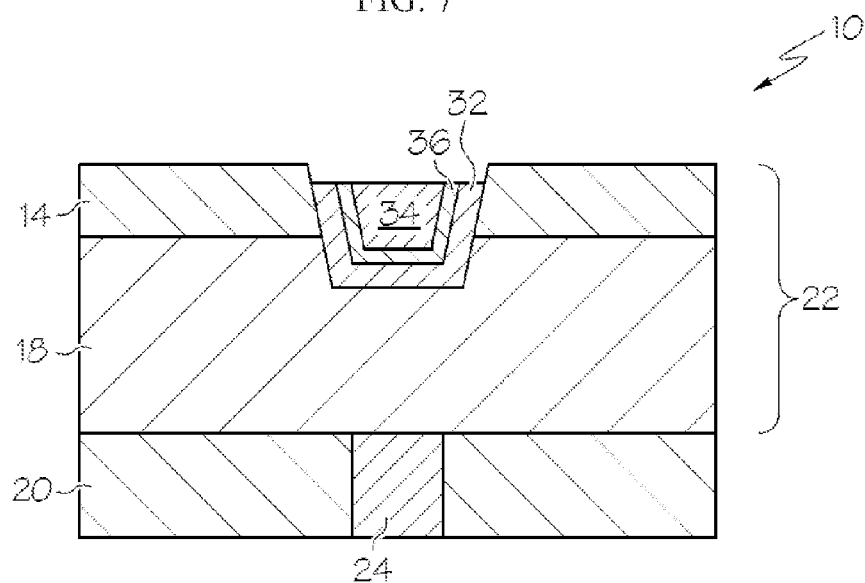
FIG. 8 is a schematic cross-sectional side view of a portion of the integrated circuit of FIG. 7, after removal of the protecting layer.

Once the embedded electrical interconnect 34 and barrier layer 32 are recessed within the substrate 12, the protecting layer 16 is removed from the oxide layer 14 as shown in FIG. 8. Techniques for removing the protecting layer 16 are not particularly limited and can include CMP or wet etching, thereby exposing a surface of the oxide layer 14.

Figure 9:
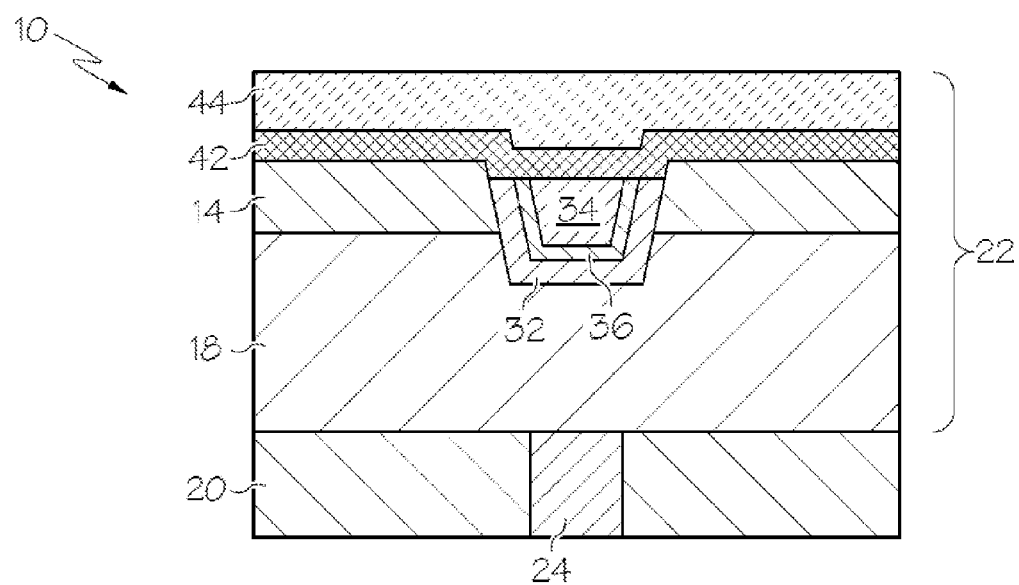
FIG. 9 is a schematic cross-sectional side view of a portion of the integrated circuit of FIG. 8, with a capping layer and an NBLoK layer formed over the embedded electrical interconnect and the oxide layer.
Figure 10:
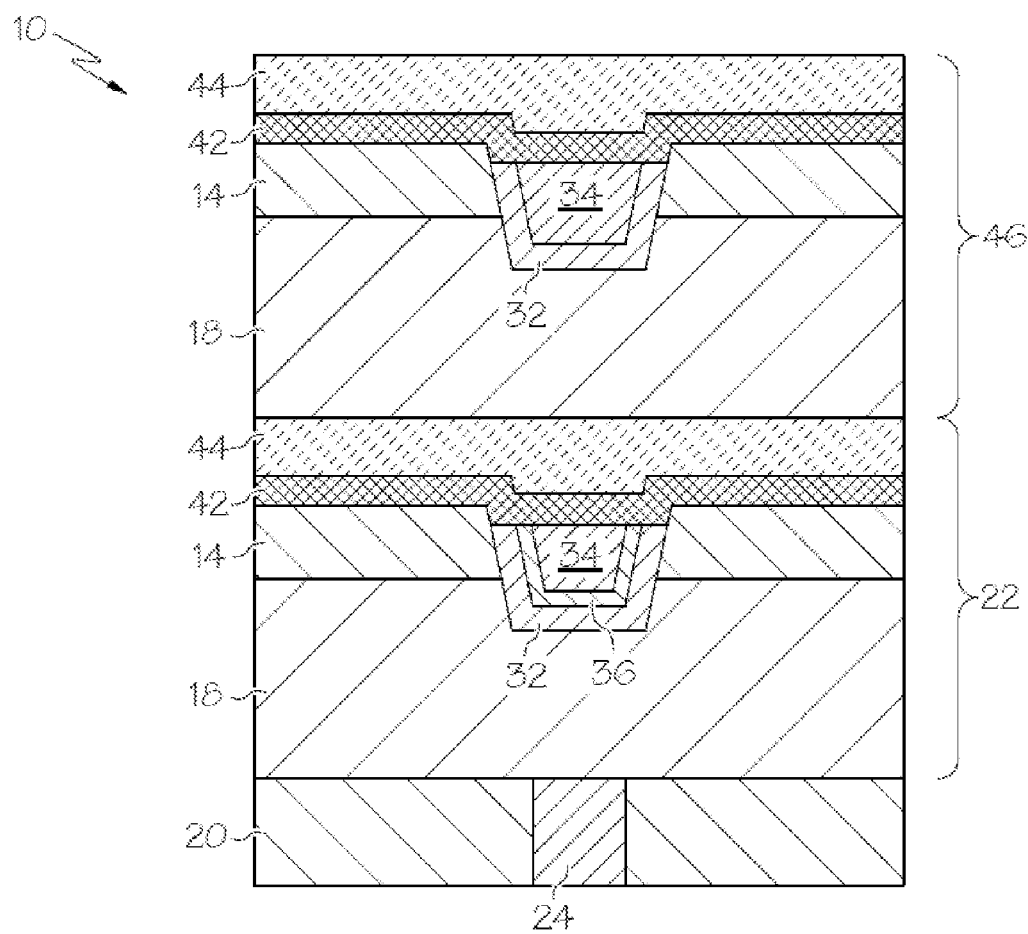
FIG. 10 is a schematic cross-sectional side view of a portion of the integrated circuit of FIG. 9, with an overlying substrate having another embedded electrical interconnect formed over the capping layer and NBLoK layer.

Referring to FIG. 9, once the embedded electrical interconnect 34 and the barrier layer 32 are recessed within the substrate 12, and once the protecting layer 16 is removed, additional layers may be deposited over the embedded electrical interconnect 34, the oxide layer 14, and other features in accordance with fabrication techniques known in the art. For example, in an embodiment and as shown in FIG. 9, a capping layer 42 is formed over the embedded electrical interconnect 34 and barrier layer 32 after recessing the embedded electrical interconnect 34 and barrier layer 32 and after removing the protecting layer 16. The capping layer 42 is typically formed from a dielectric material and serves to passivate the embedded electrical interconnect 34 within the substrate 12. In an embodiment, the capping layer 42 includes silicon nitride and is formed directly over the oxide layer 14, the embedded electrical interconnect 34, and the barrier layer 32, followed by formation of a $SiN_xC_yH_z$ layer 44 (referred to in the art as NBLoK; shown in FIG. 9). As shown in FIG. 9, the capping layer 42 and the NBLoK layer 44 that are formed over the embedded electrical interconnect 34 may be considered part of the interlayer dielectric substrate 22 as the capping layer 42 may serve to electrically isolate the embedded electrical interconnect 34 from other embedded electrical interconnects 34 that may subsequently be formed in additional overlaying substrates 46, and the NBLoK layer 44 may serve to provide further dielectric insulation between the embedded electrical interconnect 34 and the additional overlaying substrate 12 as well as to provide etch-stop functions during formation of recesses as vias in the additional overlaying substrate 12. Alternatively, the capping layer 42 and NBLoK layer 44 may perform other functions as may be desirable in accordance with design considerations. In an embodiment, as shown in cross-section in FIG. 10 and as alluded to above, an overlying substrate 46 having another embedded electrical interconnect 34 may be formed over the capping layer 42 (more specifically, directly over the NBLoK layer 44).

As set forth above, and as partially shown in FIG. 11, an integrated circuit 10 is provided. The integrated circuit 10 includes a base substrate 20 and an interlayer dielectric substrate 22 disposed over the base substrate 20. The interlayer dielectric substrate 22 has an embedded electrical interconnect 34 disposed therein and a barrier layer 32 disposed between the embedded electrical interconnect 34 and the interlayer dielectric substrate 22. The embedded electrical interconnect 34 and the barrier layer 32 are recessed within the interlayer dielectric substrate 22 and have a recessed interconnect surface 48 and a recessed barrier surface 50, respectively. The recessed barrier surface 50 is on common plane with the recessed interconnect surface 48. The integrated circuit 10 may include a capping layer 42 disposed over and in contact with the embedded electrical interconnect 34. An overlying substrate 46 having another embedded electrical interconnect 34 disposed therein may be disposed over the capping layer 42.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit comprising:
providing a substrate including a protecting layer over an oxide layer, wherein the oxide layer has an upper surface defining an oxide layer plane;
etching a recess through the protecting layer and into the oxide layer;
depositing a barrier material over the substrate to form a barrier layer including a first region in the recess and a second region outside the recess;
depositing a conductive material over the barrier layer and forming an embedded electrical interconnect in the recess and an overburden region outside the recess;
removing the overburden region of the conductive material;
recessing a portion of the embedded electrical interconnect to a recessed surface defining an electrical interconnect plane, wherein the electrical interconnect plane is beneath the oxide layer plane;
after recessing the portion of the embedded electrical interconnect, etching the barrier layer to remove the second region of the barrier layer and to recess a portion of the first region of the barrier layer; and
after etching the barrier layer, removing the protecting layer from the oxide layer.

2. The method of claim 1 wherein etching the barrier layer to remove the second region of the barrier layer and to recess a portion of the first region of the barrier layer comprises forming an upper surface of the barrier layer defining a barrier layer plane beneath the oxide layer plane.

3. The method of claim 1 wherein the barrier material is titanium nitride and wherein removing the overburden region of the conductive material comprises removing the overburden region of the conductive material by a chemical mechanical planarization (CMP) process that comprises landing the CMP process on the titanium nitride barrier layer.

4. The method of claim 3 wherein the CMP process uses a slurry, and wherein the slurry etches the embedded electrical interconnect to recess the portion of the embedded electrical interconnect during the CMP process.

5. The method of claim 1 wherein the conductive material is different from the barrier material.

6. The method of claim 1 wherein providing the substrate includes providing the protecting layer disposed directly on the oxide layer.

7. The method of claim 1 wherein providing the substrate includes providing the substrate including a protecting layer comprising titanium nitride.

8. The method of claim 1 wherein recessing a portion of the embedded electrical interconnect comprises recessing a portion of the embedded electrical interconnect to an interconnect recess depth, wherein etching the barrier layer to recess a portion of the first region of the barrier comprises etching the barrier layer to recess a portion of the first region of the barrier to a barrier recess depth on a common plane with the interconnect recess depth.

9. The method of claim 1 wherein depositing a barrier material comprises depositing a barrier material comprising tantalum nitride to form a barrier layer comprising tantalum nitride.

10. The method of claim 1 wherein providing a substrate comprises providing a substrate including a protecting layer over an oxide layer over a dielectric layer over a base substrate having an embedded electrical contact, wherein etching a recess comprises etching a recess through the protecting layer, through the oxide layer, and into the dielectric layer over the embedded electrical contact and exposing a surface of the embedded electrical contact, and wherein recessing a portion of the embedded electrical interconnect defines the electrical interconnect plane located between the oxide layer plane and the base substrate.

11. The method of claim 1 further comprising:
forming a capping layer over the embedded electrical interconnect and the barrier layer after removing the protecting layer from the oxide layer; and
forming an overlying substrate having another embedded electrical interconnect over the capping layer.

12. The method of claim 1 further comprising depositing a liner material over the barrier layer to form a liner layer having a first region in the recess and a second region outside the recess, wherein depositing the conductive material over the barrier layer comprises depositing the conductive material over the liner layer, and wherein etching the barrier layer comprises etching the liner layer to remove the second region of the liner layer and to recess a portion of the first region of the liner layer.

13. The method of claim 12 wherein the conductive material is deposited directly upon the liner layer.

14. A method for fabricating an integrated circuit comprising:
providing a substrate including a protecting layer over an oxide layer, wherein the oxide layer has an upper surface defining an oxide layer plane;
etching a recess through the protecting layer and into the oxide layer;
forming a barrier layer over the substrate including a first region in the recess and a second region outside the recess;
depositing an electrically-conductive material over the barrier layer in the recess to form an embedded electrical interconnect and an overburden region;
performing a planarization process with a slurry to remove the overburden region, wherein the slurry recesses a portion of the embedded electrical interconnect to a recessed surface defining an electrical interconnect plane, wherein the electrical interconnect plane is beneath the oxide layer plane;
after performing the planarization process, etching the barrier layer to remove the second region of the barrier layer and to recess a portion of the first region of the barrier layer; and
after etching the barrier layer, removing the protecting layer from the oxide layer.

15. The method of claim 14 further comprising forming a liner layer over the barrier layer and including a first region in the recess and a second region outside the recess; wherein etching the barrier layer to remove the second region of the barrier layer and to recess a portion of the first region of the barrier layer comprises etching the liner layer to remove the second region of the liner layer and to recess a portion of the first region of the liner layer and comprises forming an upper surface of the barrier layer and liner layer defining a barrier/liner layer plane beneath the oxide layer plane.

16. The method of claim 14 wherein providing a substrate comprises providing a substrate including a protecting layer over an oxide layer over a dielectric layer over a base substrate having an embedded electrical contact, and wherein etching a recess comprises etching a recess through the protecting layer, through the oxide layer, and into the dielectric layer over the embedded electrical contact and exposing a surface of the embedded electrical contact.

17. The method of claim 16 further comprising:
after removing the protecting layer from the oxide layer, forming a capping layer over the embedded electrical interconnect and the barrier layer; and
forming an overlying substrate having another embedded electrical interconnect over the capping layer.

18. A method for fabricating an integrated circuit comprising:
providing a substrate including a protecting layer over an oxide layer, wherein the oxide layer has a thickness of no more than about 10 nanometers (nm), and wherein the oxide layer has an upper surface defining an oxide layer plane;
etching a recess through the protecting layer and into the oxide layer;
depositing a barrier material over the substrate to form a barrier layer including a first region in the recess and a second region outside the recess;
depositing an electrically-conductive material over the barrier layer in the recess to form an embedded electrical interconnect and an overburden region;
removing the overburden region of the electrically-conductive material;
recessing a portion of the embedded electrical interconnect with an etchant to a recessed surface defining an electrical interconnect plane, wherein the electrical interconnect plane is beneath the oxide layer plane, wherein the barrier layer prevents the etchant from contacting the substrate; and
after recessing the portion of the embedded electrical interconnect, etching the barrier layer to remove the second region of the barrier layer and to recess a portion of the first region of the barrier layer.

19. The method of claim 18 wherein providing a substrate comprises providing a substrate including a protecting layer over an oxide layer over a dielectric layer over a base substrate having an embedded electrical contact, wherein etching a recess comprises etching a recess through the protecting layer, through the oxide layer, and into the dielectric layer over the embedded electrical contact and exposing a surface of the embedded electrical contact, and wherein recessing the portion of the embedded electrical interconnect forms the recessed surface with an electrical interconnect plane located between the oxide layer plane and the base substrate.

20. The method of claim 18 further comprising:
removing the protecting layer from the oxide layer;
forming a capping layer over the embedded electrical interconnect and the barrier layer; and
forming an overlying substrate having another embedded electrical interconnect over the capping layer.

* * * * *